(12) United States Patent
Liu

(10) Patent No.: US 11,843,026 B2
(45) Date of Patent: Dec. 12, 2023

(54) METHOD FOR MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/712,415

(22) Filed: Apr. 4, 2022

(65) Prior Publication Data

US 2022/0231119 A1 Jul. 21, 2022

Related U.S. Application Data

(63) Continuation of application No. PCT/CN2021/111467, filed on Aug. 9, 2021.

(30) Foreign Application Priority Data

Nov. 19, 2020 (CN) .......................... 202011305915.5

(51) Int. Cl.
*H01L 21/00* (2006.01)
*H01L 49/02* (2006.01)
*H10B 12/00* (2023.01)

(52) U.S. Cl.
CPC .............. *H01L 28/92* (2013.01); *H01L 28/91* (2013.01); *H10B 12/31* (2023.02); *H10B 12/0335* (2023.02)

(58) Field of Classification Search
CPC ......... H01L 28/92; H01L 28/91; H10B 12/31; H10B 12/0335
See application file for complete search history.

(56) References Cited

U.S. PATENT DOCUMENTS

| | | | |
|---|---|---|---|
| 9,018,733 B1 | 4/2015 | Lee et al. | |
| 2020/0303763 A1* | 9/2020 | Seitz | .................. H01M 10/052 |
| 2022/0231119 A1* | 7/2022 | Liu | ........................ H10B 12/31 |
| 2023/0026612 A1* | 1/2023 | Bae | .................... G02B 26/0875 |

FOREIGN PATENT DOCUMENTS

| | | |
|---|---|---|
| CN | 101005074 A | 7/2007 |
| CN | 102117776 B | 3/2013 |
| CN | 107706206 A | 2/2018 |
| CN | 110970460 A | 4/2020 |

* cited by examiner

*Primary Examiner* — Richard A Booth
(74) *Attorney, Agent, or Firm* — Cooper Legal Group, LLC

(57) ABSTRACT

A method for manufacturing a semiconductor structure and a semiconductor structure are provided. The method includes: providing a substrate, and forming a first isolating layer, a first stabilizing layer, a second isolating layer and a second stabilizing layer, which are sequentially stacked onto one another, on the substrate; forming a through hole penetrating through the first isolating layer, the first stabilizing layer, the second isolating layer and the second stabilizing layer, and forming a lower electrode on a side wall and a bottom portion of the through hole; removing a portion of a thickness of the second stabilizing layer to expose a portion of the lower electrode; forming a mask layer on a side wall of the exposed lower electrode; and etching the second stabilizing layer by using the mask layer as a mask to form a first opening.

8 Claims, 11 Drawing Sheets

METHOD FOR MANUFACTURING SEMICONDUCTOR STRUCTURE AND SEMICONDUCTOR STRUCTURE

CROSS-REFERENCE TO RELATED APPLICATIONS

This is a continuation application of International Patent Application No. PCT/CN2021/111467, filed on Aug. 9, 2021, which claims priority to Chinese Patent Application No. 202011305915.5, filed on Nov. 19, 2020. The disclosures of International Patent Application No. PCT/CN2021/111467 and Chinese Patent Application No. 202011305915.5 are incorporated by reference herein in their entireties.

BACKGROUND

A memory in a semiconductor structure is a memory component used for storing programs and various data information. A random access memory is divided into a static random access memory and a dynamic random access memory. The dynamic random access memory typically includes a capacitor and a transistor connected to the capacitor. The capacitor is configured for storing charges representative of stored information. The transistor is a switch for controlling charges to flow into and release from the capacitor.

As memory process nodes continue to shrink, the manufacturing process of the capacitor is becoming more and more complex, and the quality of the capacitor needs to be improved.

SUMMARY

Embodiments of the disclosure relate to, but are not limited to, a method for manufacturing a semiconductor structure and a semiconductor structure. Embodiments of the disclosure provide a method for manufacturing a semiconductor structure and a semiconductor structure, so as to simplify the manufacturing process of a capacitor, and to improve the quality of the capacitor.

An embodiment of the disclosure provides a method for manufacturing a semiconductor structure. The method for manufacturing the semiconductor structure includes the following operations. A substrate is provided, and a first isolating layer, a first stabilizing layer, a second isolating layer and a second stabilizing layer, which are sequentially stacked onto one another, are formed on the substrate. A through hole penetrating through the first isolating layer, the first stabilizing layer, the second isolating layer and the second stabilizing layer is formed, and a lower electrode is formed on a side wall and a bottom portion of the through hole. A portion of a thickness of the second stabilizing layer is removed, so as to expose a portion of the lower electrode. A mask layer is formed on a side wall of the exposed lower electrode, in which the mask layers on the side walls of two adjacent lower electrodes are in contact with each other. The second stabilizing layer is etched by using the mask layer as a mask, so as to form a first opening.

An embodiment of the disclosure also provides a semiconductor structure. The semiconductor structure includes: a substrate; a first stabilizing layer and a second stabilizing layer separately arranged on the substrate, the first stabilizing layer being arranged close to the substrate, and the second stabilizing layer being arranged away from the substrate; a lower electrode penetrating through the first stabilizing layer and the second stabilizing layer, a bottom surface of the lower electrode being in contact with the substrate; and a mask layer arranged on a side wall of the lower electrode, the mask layer being further arranged on the second stabilizing layer, and the mask layers on the side walls of two adjacent lower electrodes being in contact with each other.

BRIEF DESCRIPTION OF THE DRAWINGS

One or more embodiments are exemplarily explained through the figures in the accompanying drawings corresponding thereto, these exemplary explanations do not constitute a limitation to the embodiments, elements having same reference numerals in the accompanying drawings are denoted as similar elements; and unless otherwise specifically declared, the figures in the accompanying drawings do not constitute a limitation of proportion.

DETAILED DESCRIPTION

It can be known from the background that the manufacturing process of the capacitor is becoming more and more complex, and the quality of the capacitor needs to be improved.

Figure 1:
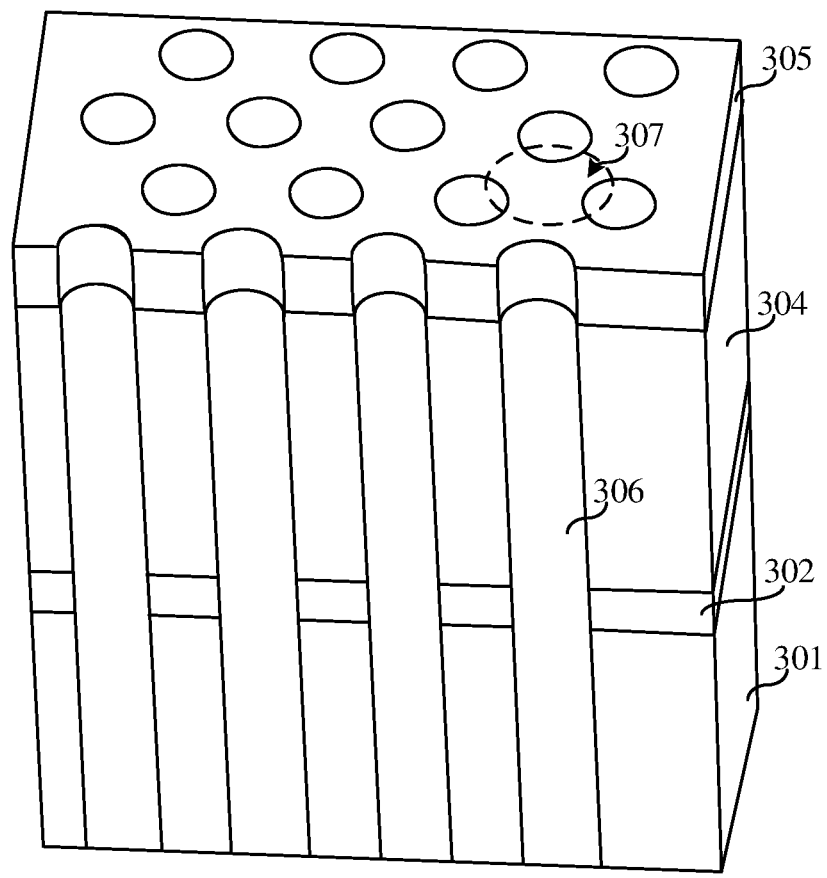
FIG. 1 is a perspective view of a semiconductor structure.
Figure 2:
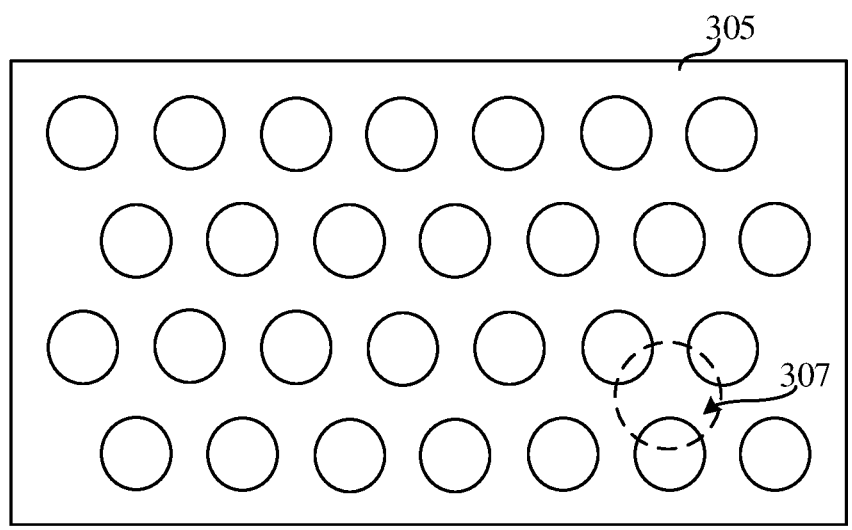
FIG. 2 is a top view of FIG. 1.

Referring to FIG. 1 and FIG. 2, FIG. 1 is a schematic view of a semiconductor structure. FIG. 2 is a top view of FIG. 1. The semiconductor structure includes: a first isolating layer 301, a first stabilizing layer 302, a second isolating layer 304, and a second stabilizing layer 305, which are sequentially stacked onto one another; and a lower electrode 306 penetrating through the first isolating layer 301, the first stabilizing layer 302, the second isolating layer 304 and the second stabilizing layer 305.

It was found that in order to prevent the lower electrode 306 from tilting or collapsing, the first stabilizing layer 302 and the second stabilizing layer 305 are typically formed before forming the lower electrode 306. After forming the lower electrode 306, the first stabilizing layer 302 and the second stabilizing layer 305 need to be etched to form an opening 307, so as to remove the first isolating layer 301 and the second isolating layer 304, and a dielectric layer and an upper electrode are formed on the side wall of the lower electrode 306. The second stabilizing layers 305 between three adjacent lower electrodes 306 and a portion of the lower electrodes 306 are typically etched, so as to form the opening 307. Since the memory process nodes of the memory are continuously reduced, the distance between the lower electrodes 306 is becoming shorter and shorter, and the problem of misalignment may easily occur during exposure. Therefore, the opening 307 is typically formed through a dual patterning process. However, the dual patterning process is complex and costly.

An embodiment of the disclosure provides a method for manufacturing a semiconductor structure. The method for manufacturing the semiconductor structure includes the following operations. A portion of a thickness of the second stabilizing layer is removed. A mask layer is formed on a side wall of the exposed lower electrode. The mask layers on the side walls of two adjacent lower electrodes are in contact with each other. The second stabilizing layer is etched by using the mask layer as a mask to form a first opening. Therefore, in an embodiment of the disclosure, the first opening is prevented from being formed through the dual patterning process, which can simplify the process, and reduce the production cost. In addition, since the lower electrode is avoided from being etched, the lower electrode is unlikely to collapse. Therefore, the whole capacitor has better stability.

In order to make the objectives, technical solutions and advantages of the embodiments of the disclosure more apparent, hereinafter, the embodiments of the disclosure will be described in detail in connection with the accompanying drawings. However, those ordinary skilled in the art may understand that, in the embodiments of the disclosure, numerous technical details are set forth in order to provide readers with a better understanding of the disclosure. However, the technical solutions claimed in the disclosure can also be implemented without these technical details and various changes and modifications based on the embodiments below.

An embodiment of the disclosure provides a method for manufacturing a semiconductor structure. FIG. 3 to FIG. 14 are schematic views of structures corresponding to various operations in a method for manufacturing a semiconductor structure according to an embodiment of the disclosure.

Figure 3:
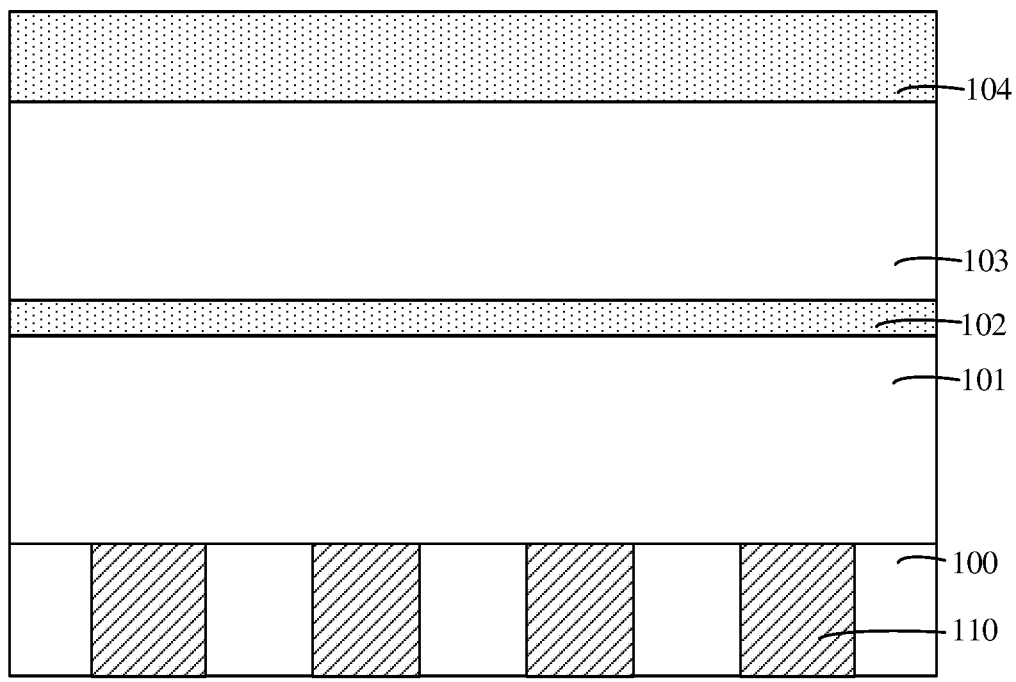
FIGS. 3-14 are schematic views of structures corresponding to various operations in a method for manufacturing a semiconductor structure according to an embodiment of the disclosure.

Referring to FIG. 3, a substrate 100 is provided, and a first isolating layer 101, a first stabilizing layer 102, a second isolating layer 103 and a second stabilizing layer 104, which are sequentially stacked onto one another, are formed on the substrate 100.

The substrate 100 includes a semiconductor material such as silicon and germanium, or an insulating material such as silicon on insulator (SOI), strained silicon on insulator (SSOI), strained silicon germanium on insulator (S—SiGeOI), silicon germanium on insulator (SiGeOI), and germanium on insulator (GeOI).

A capacitive contact layer 110 is provided in the substrate 100. In an embodiment of the disclosure, there are multiple capacitive contact layers 110, and the multiple capacitive contact layers 110 may be arranged hexagonally and configured for electrically connecting an array of transistors of a memory.

The first stabilizing layer 102 and the second stabilizing layer 104 are configured to support a lower electrode subsequently formed, so as to prevent the lower electrode from tilting or collapsing. The material of each of the first stabilizing layer 102 and the second stabilizing layer 104 contains silicon nitride or silicon carbonitride. In an embodiment of the disclosure, the material of the first stabilizing layer 102 is the same as the material of the second stabilizing layer 104. In some embodiments of the disclosure, the material of the first stabilizing layer may be different from the material of the second stabilizing layer. Since a portion of a thickness of the second stabilizing layer 104 needs to be removed subsequently, the thickness of the second stabilizing layer 104 may be greater than that of the first stabilizing layer 102, in order to ensure that the second stabilizing layer 104 can be used for reinforcing the lower electrode.

The first isolating layer 101 and the second isolating layer 103 are removed in a subsequent process of forming a structure such as an upper electrode or a dielectric layer. The material of each of the first isolating layer 101 and the second isolating layer 103 is borophosphosilicate glass. In an embodiment of the disclosure, the material of the first isolating layer 101 is the same as the material of the second isolating layer 103. In some embodiments of the disclosure, the material of the first isolating layer may be different from the material of the second isolating layer.

Figure 4:
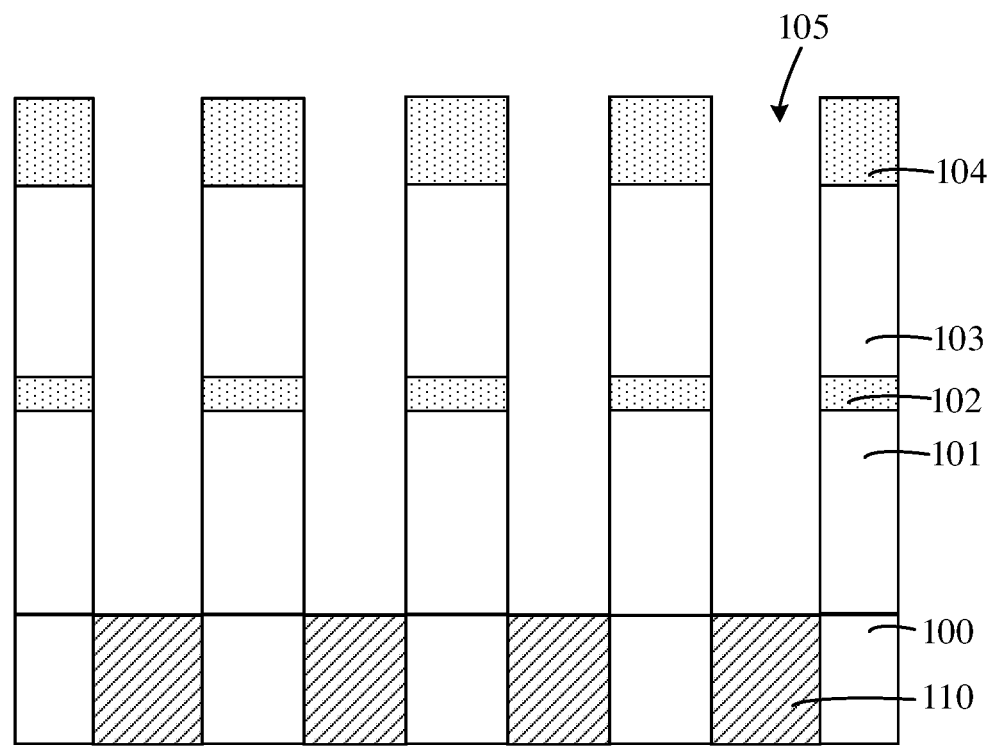
Figure 5:
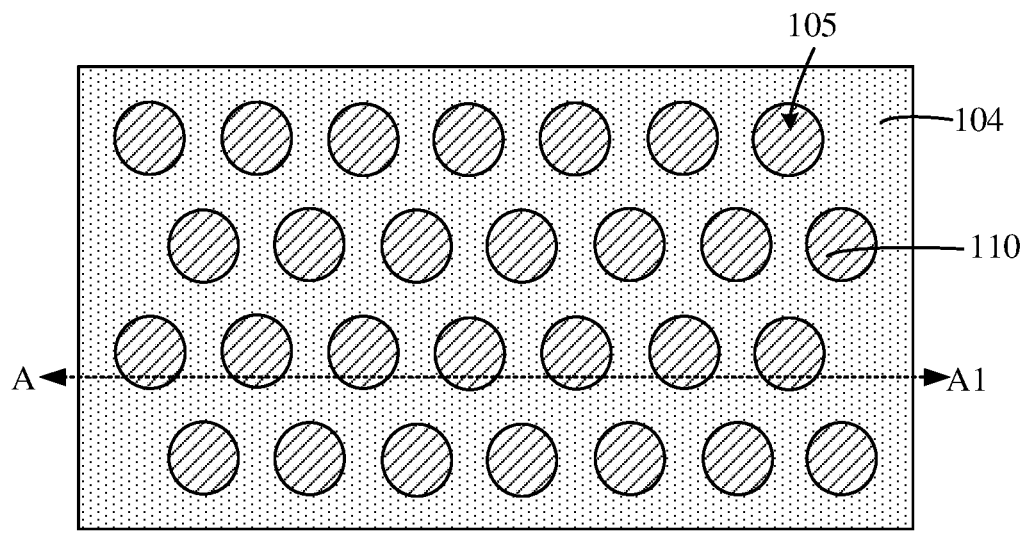

Referring to FIG. 4 and FIG. 5, FIG. 4 is a partial cross-sectional view taken along a direction A-A1 shown in FIG. 5. A through hole 105 penetrating through the first isolating layer 101, the first stabilizing layer 102, the second isolating layer 103 and the second stabilizing layer 104 is formed.

The through hole 105 exposes the capacitive contact layer 110, and the through hole 105 provides space for subsequent formation of the lower electrode and the filling layer.

In an embodiment of the disclosure, each through hole 105 is located directly above the corresponding capacitive contact layer 110. In an embodiment of the disclosure, the through hole 105 exposes the entire surface of the capacitive contact layer 110, so that the contact area between the capacitive contact layer 110 and the lower electrode subsequently formed can be increased, thereby reducing the contact resistance. In some embodiments of the disclosure, the through hole 105 may also expose only a portion of the surface of the capacitive contact layer 110.

Figure 6:
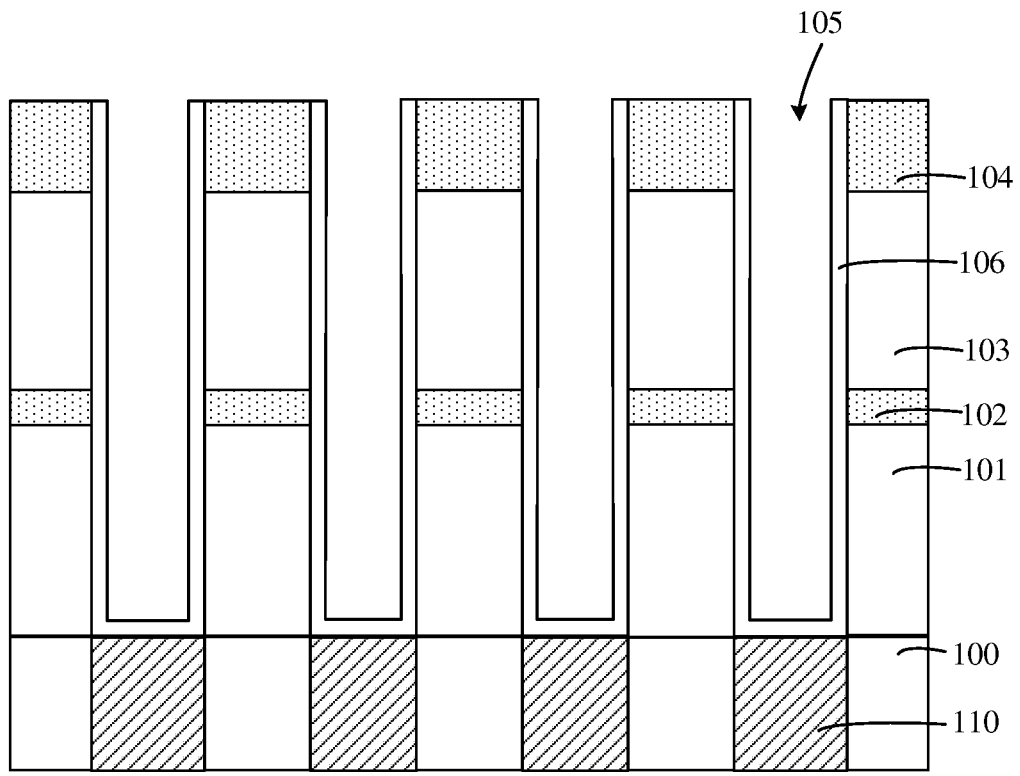
Figure 7:
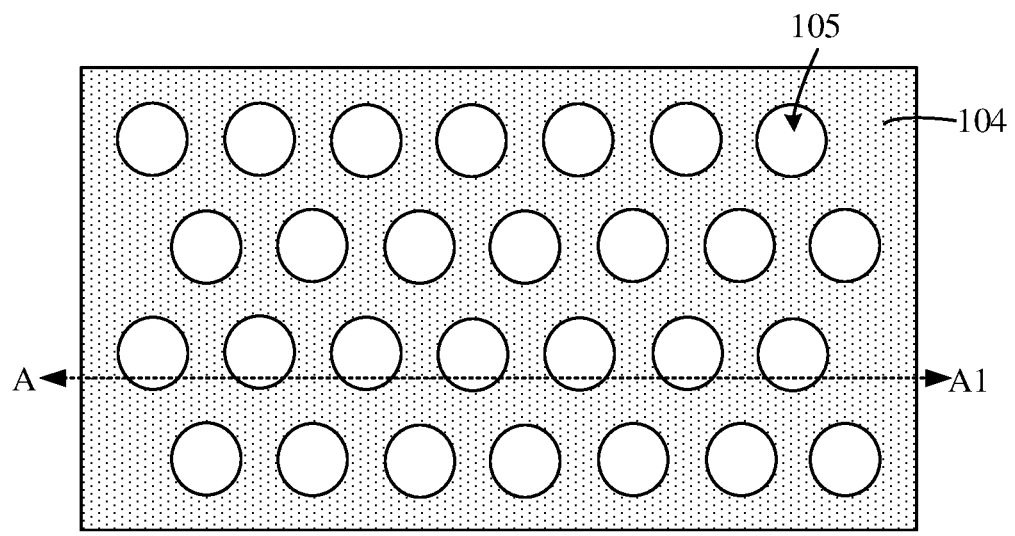

Referring to FIG. 6 and FIG. 7, FIG. 6 is a partial cross-sectional view taken along a direction A-A1 shown in FIG. 7. A lower electrode 106 is formed on a side wall and a bottom portion of the through hole 105. The lower electrode 106 is electrically connected to the capacitive contact layer 110. The material of the lower electrode 106 contains titanium nitride or titanium.

In an embodiment of the disclosure, the lower electrode 106 is formed through an atomic layer deposition process.

Figure 8:
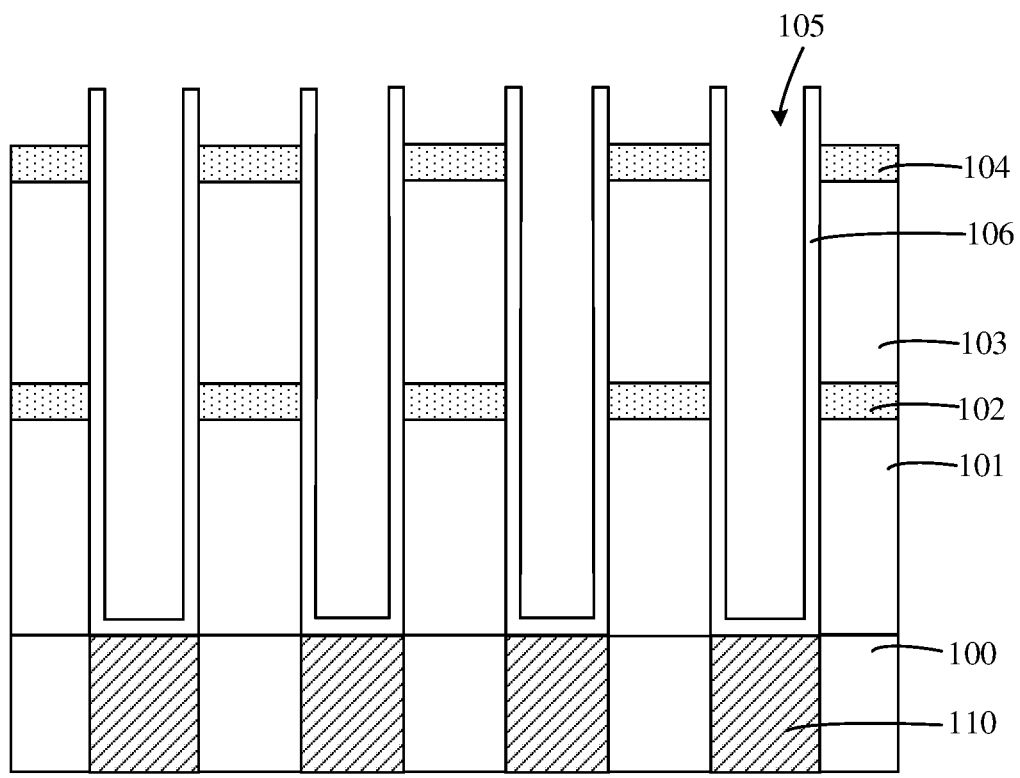

Referring to FIG. 8, a portion of a thickness of the second stabilizing layer 104 is removed, so as to expose a portion of the lower electrode 106. The portion of the second stabilizing layer 104 may be removed through a wet etching process or a dry etching process.

Figure 9:
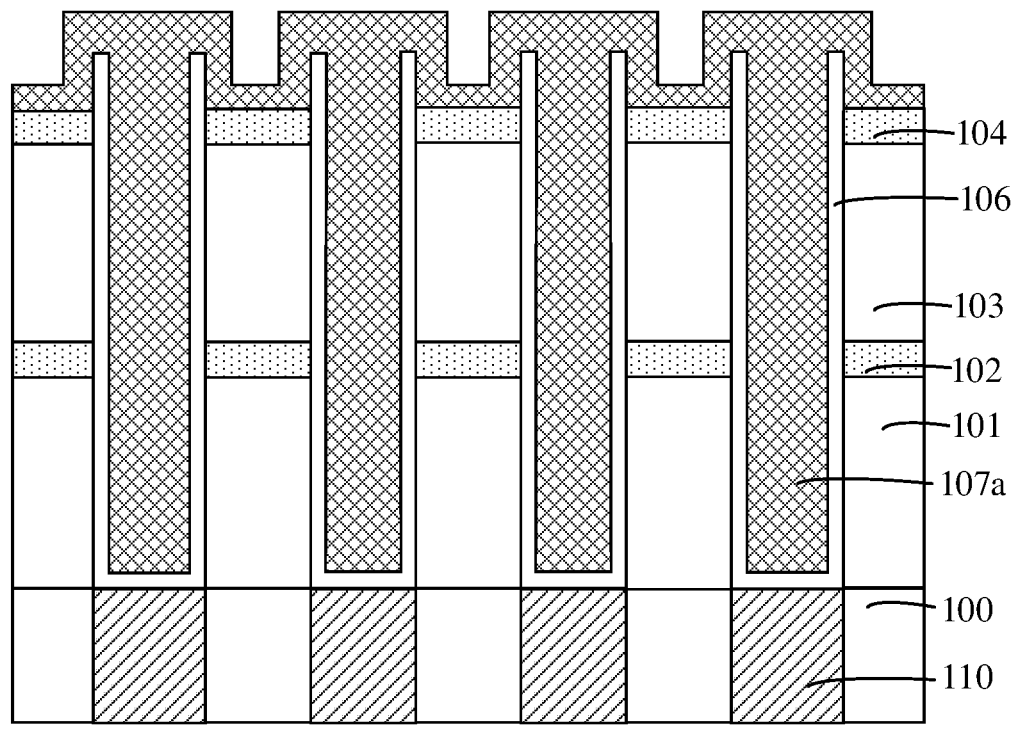
Figure 10:
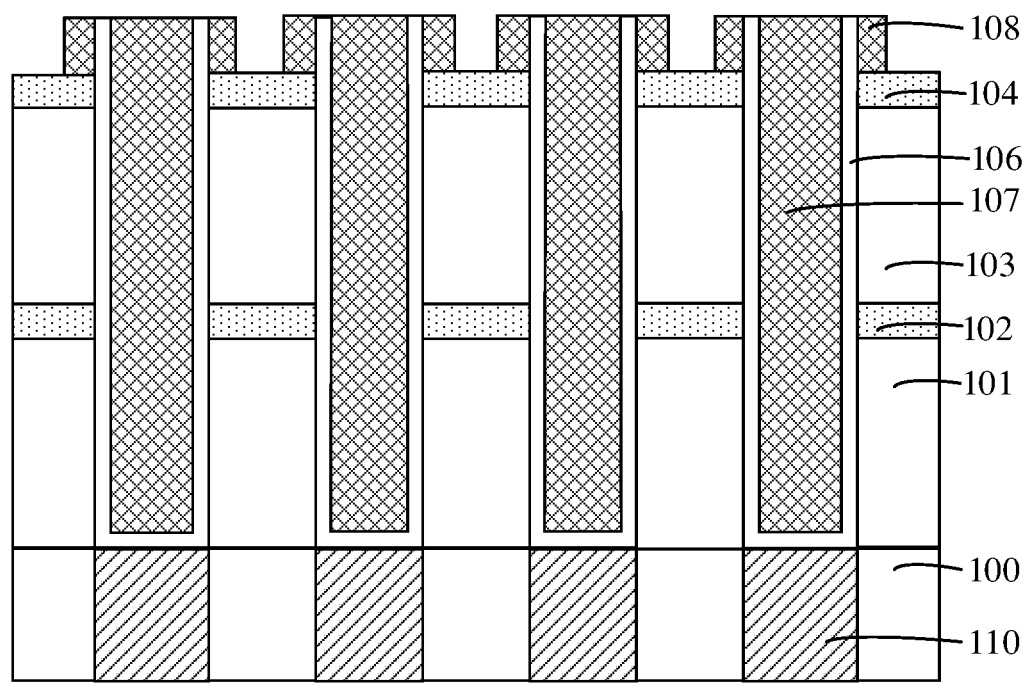
Figure 11:
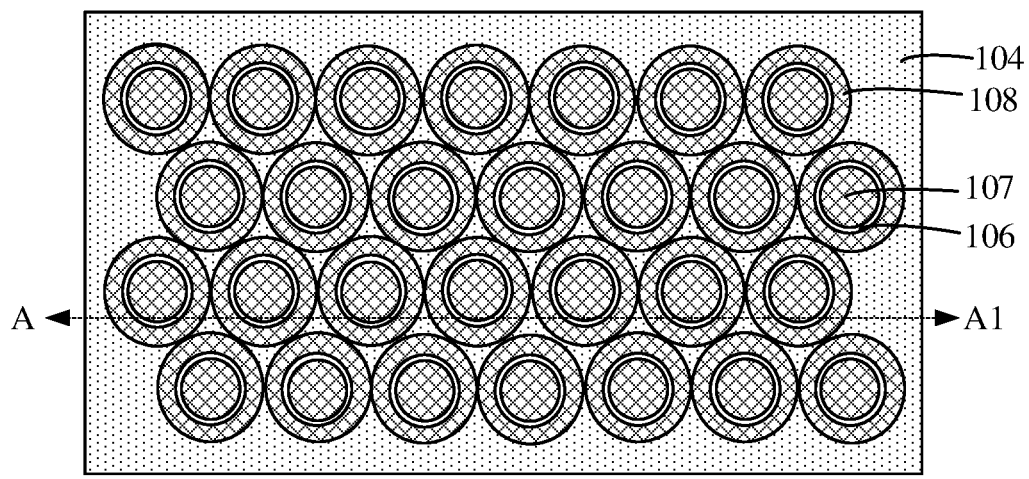

Referring to FIG. 9 to FIG. 11, FIG. 10 is a partial cross-sectional view taken along a direction A-A1 shown in FIG. 11. A filling layer 107 for filling the through hole 105 is formed. A mask layer 108 is formed on the side wall of the exposed lower electrode 106. The mask layers 108 on the side walls of two adjacent lower electrodes 106 are in contact with each other.

In an embodiment of the disclosure, the filling layer 107 is in the form of a single-layer structure. That is, an inner wall of the lower electrode 106 may not form a dielectric layer and an upper electrode. The finally formed capacitor will be a columnar capacitor. The columnar capacitor is firmer. Accordingly, a width-to-depth ratio of the columnar capacitor can be increased, thereby increasing the amount of charges that can be accommodated in the columnar capacitor. It should be noted that the through hole 105 may be directly filled when the lower electrode 106 is formed. In this case, the columnar capacitor may be formed without additionally forming the filling layer 107.

The material of the filling layer 107 contains polycrystalline silicon or germanium-silicon. The filling rate and strength of polycrystalline silicon or germanium-silicon are higher than those of titanium nitride. Therefore, forming the filling layer 107 with polycrystalline silicon or germanium-silicon as the material can improve the production efficiency, reduce the production cost, and also can improve the strength of the capacitor, thereby improving the quality of the capacitor.

The mask layer 108 is configured to subsequently form the first opening, and the mask layer 108 can protect the lower electrode 106 from being etched, thereby ensuring the stability of the lower electrode 106.

In an embodiment of the disclosure, the filling layer 107 and the mask layer 108 are formed in a same process operation. Forming the filling layer 107 and the mask layer 108 in the same process operation can simplify the production process and reduce the production cost. It will be appreciated that in some embodiments of the disclosure, the filling layer and the mask layer may also be formed in different process operations.

The material of the mask layer 108 contains polycrystalline silicon or germanium-silicon.

The operations of forming the filling layer 107 and the mask layer 108 will be described below.

Referring to FIG. 9, an initial filling layer 107*a* is formed in the through hole 105 (referring to FIG. 8), the side wall of the exposed lower electrode 106 and the surface of the second stabilizing layer 104.

The initial filling layer 107*a* may also cover a top surface of the lower electrode 106.

In an embodiment of the disclosure, the initial filling layer 107*a* is formed through the chemical vapor deposition process. The rate in the chemical vapor deposition process is relatively high, so that the production efficiency can be improved. In some embodiments of the disclosure, the atomic layer deposition process or the physical vapor deposition technology may also be adopted.

Referring to FIG. 10 and FIG. 11, FIG. 10 is a partial cross-sectional view taken along a direction A-A1 shown in FIG. 11. A portion of the initial filling layer 107*a* (referring to FIG. 9) on the surface of the second stabilizing layer 104 and a portion of the initial filling layer 107*a* higher than the top surface of the lower electrode 106 are removed. The filling layer 107 in the through hole 105 (referring to FIG. 8) and the mask layer 108 on the side wall of the lower electrode 106 are formed.

In an embodiment of the disclosure, the filling layer 107 and the mask layer 108 are formed in a same process operation. The filling layer 107 fills the through hole 105, and a top surface of the filling layer 107 is flush with the top surface of the lower electrode 106.

In an embodiment of the disclosure, the filling layer 107 and the mask layer 108 are formed through the dry etching process. In some embodiments of the disclosure, the wet etching process may also be adopted.

Referring further to FIG. 10, each mask layer 108 is arranged around the lower electrode 106 and is in a cylindrical shape. The mask layers 108 on the side walls of two adjacent lower electrodes 106 are in contact with each other. In an embodiment of the disclosure, the mask layers 108 are arranged hexagonally. That is, each mask layer 108 is in contact with the other six mask layers 108. Taking three mask layers 108 in contact with each other as an example, these three mask layers 108 form an enclosed region. That is, the enclosed region is exposed by the mask layers 108, and the second stabilizing layer 104 and the first stabilizing layer 102 directly facing the enclosed region will be subsequently etched, so as to form a first opening and a second opening.

In an embodiment of the disclosure, two adjacent mask layers 108 are in contact with each other. In this case, after the first stabilizing layer 102 and the second stabilizing layer 104 are etched by using the mask layer 108 as a mask, the first stabilizing layer 102 and the second stabilizing layer 104 can form an integrated net structure.

Figure 12:
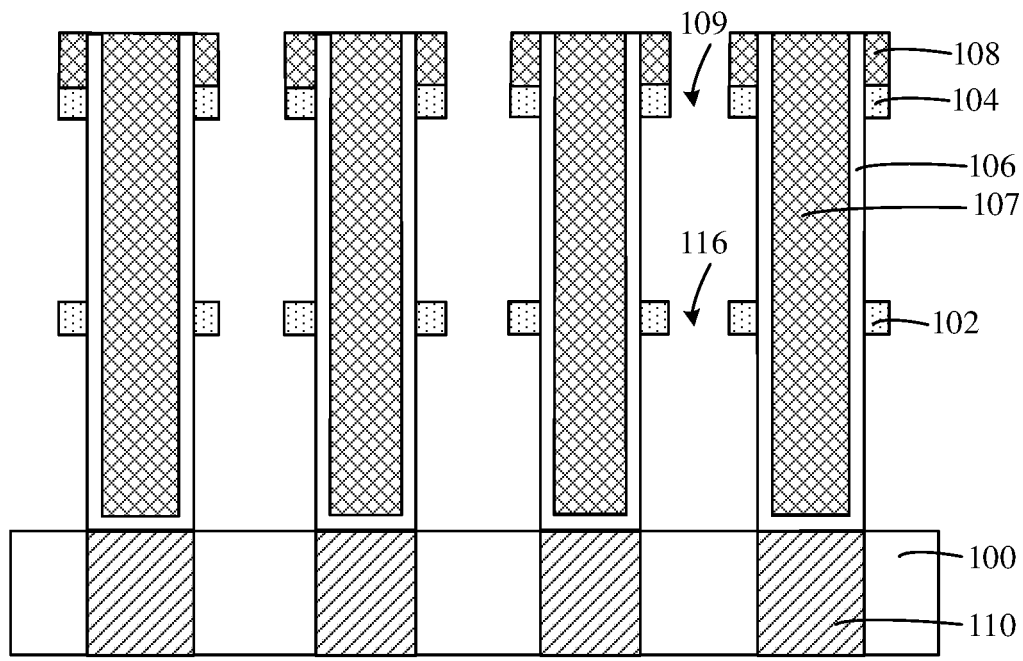
Figure 13:
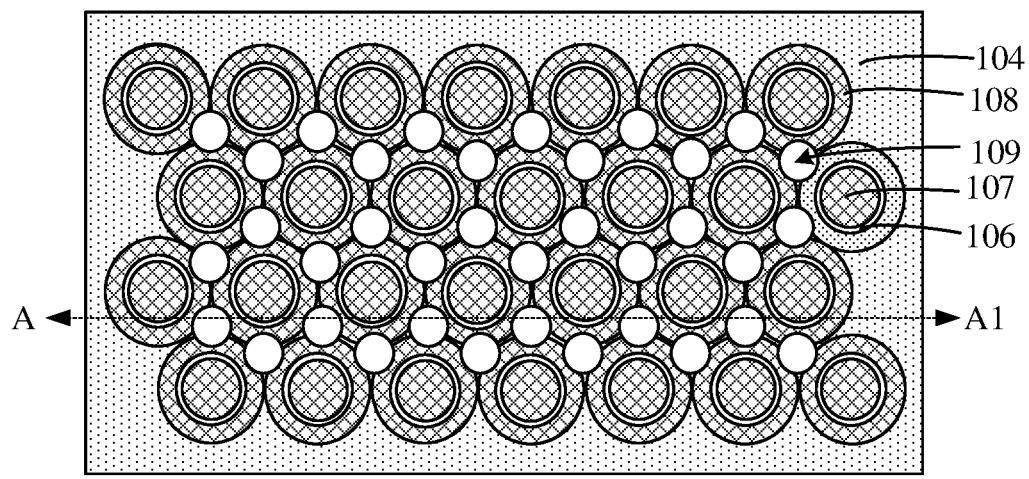

Referring to FIG. 12 and FIG. 13, FIG. 12 is a partial cross-sectional view taken along a direction A-A1 shown in FIG. 13. The second stabilizing layer 104 is etched by using the mask layer 108 as a mask, so as to form a first opening 109. In an embodiment of the disclosure, the first opening 109 is formed through the dry etching process.

In an embodiment of the disclosure, since the mask layers 108 are arranged hexagonally, the first openings 109 are also arranged hexagonally. In some embodiments of the disclosure, the mask layers and the first openings may also be arranged tetragonally.

In some embodiments of the disclosure, after forming the first opening 109, the method further includes the following operations. The second isolating layer 103 (referring to FIG. 10) is removed. After removing the second isolating layer 103, the first stabilizing layer 102 is etched by using the mask layer 108 as a mask, so as to form a second opening 116. After forming the second opening 116, the first isolating layer 101 (referring to FIG. 10) is removed. In an embodiment of the disclosure, the first isolating layer 101 and the second isolating layer 103 are removed through the wet etching process.

The second opening 116 directly faces the first opening 109.

Figure 14:
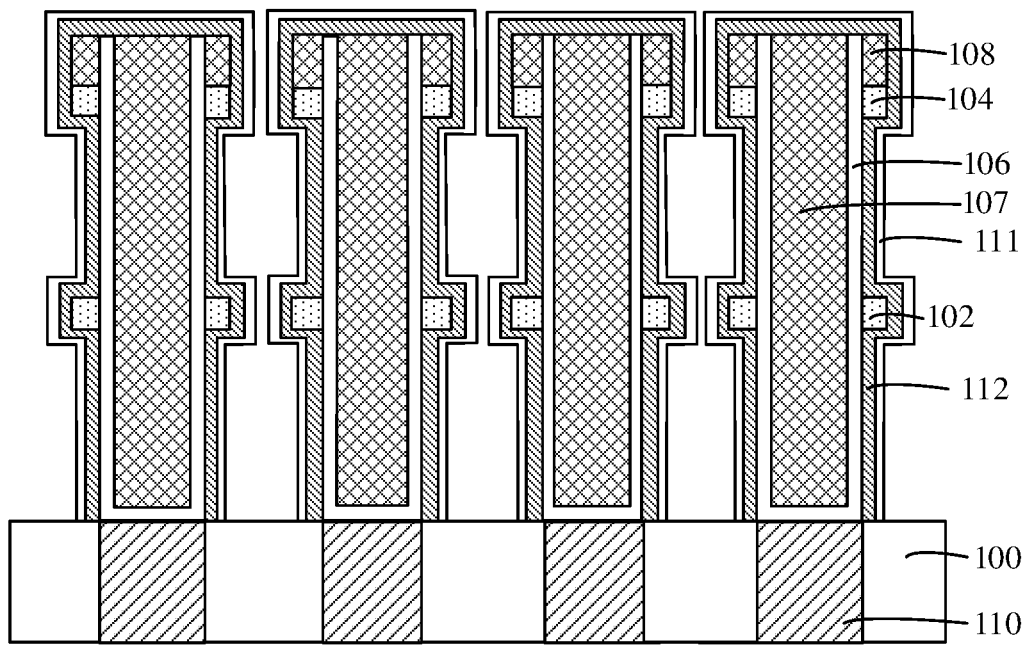

Referring to FIG. 14, a dielectric layer 112 is formed on the side wall of the lower electrode 106 and the top surface of the filling layer 107. In an embodiment of the disclosure, the dielectric layer 112 is also arranged on the surface of the first stabilizing layer 102 exposed by the first opening 109, on the surface of the second stabilizing layer 104 exposed by the second opening 116, and on the top surface of the mask layer 108.

The material of the dielectric layer 112 is a high dielectric constant material. The greater the dielectric constant is, the larger the amount of charges that can be accommodated is. The material of the dielectric layer 112 in an embodiment of the disclosure is zirconia. The material of the dielectric layer may be alumina in some embodiments of the disclosure.

In an embodiment of the disclosure, the dielectric layer 112 is formed through the atomic layer deposition process. The thickness of the dielectric layer 112 formed through the atomic layer deposition process is more uniform.

After forming the dielectric layer 112, an upper electrode 111 is formed on a surface of the dielectric layer 112. In an embodiment of the disclosure, the upper electrode 111 is formed as a thin film in contact with the dielectric layer 112, and the upper electrode 111 is formed through the atomic layer deposition process. In other embodiments, the upper electrode may also be formed through the chemical vapor deposition. The upper electrode fills a region between two adjacent lower electrodes, and may cover the surface of the dielectric layer.

In an embodiment of the disclosure, the upper electrode 111, the dielectric layer 112 and the lower electrode 106 form a columnar capacitor.

Overall, according to the embodiments of the disclosure, the mask layer 108 arranged on the side wall of the lower electrode 106 is formed, and the second stabilizing layer 104 is etched by using the mask layer 108 as a mask to form the first opening 109, so that the process difficulty and the production cost are reduced. In addition, the mask layer 108 and the filling layer 107 are simultaneously formed, so that the production process can be simplified, and the production efficiency can be improved. In addition, the filling layer 107 is in the form of a single-layer structure, that is, the capacitor is a columnar capacitor, so that the capacitor has better stability and higher strength.

In some embodiments of the disclosure, referring to FIG. 15 to FIG. 20, FIG. 15 to FIG. 20 are schematic views of structures corresponding to various operations in a method for manufacturing a semiconductor structure according to an embodiment of the disclosure. Reference will now be made to the accompanying drawings. The same or similar parts as those described in the above embodiments will be described with reference to the above embodiments, and will not be described in detail herein.

Figure 15:
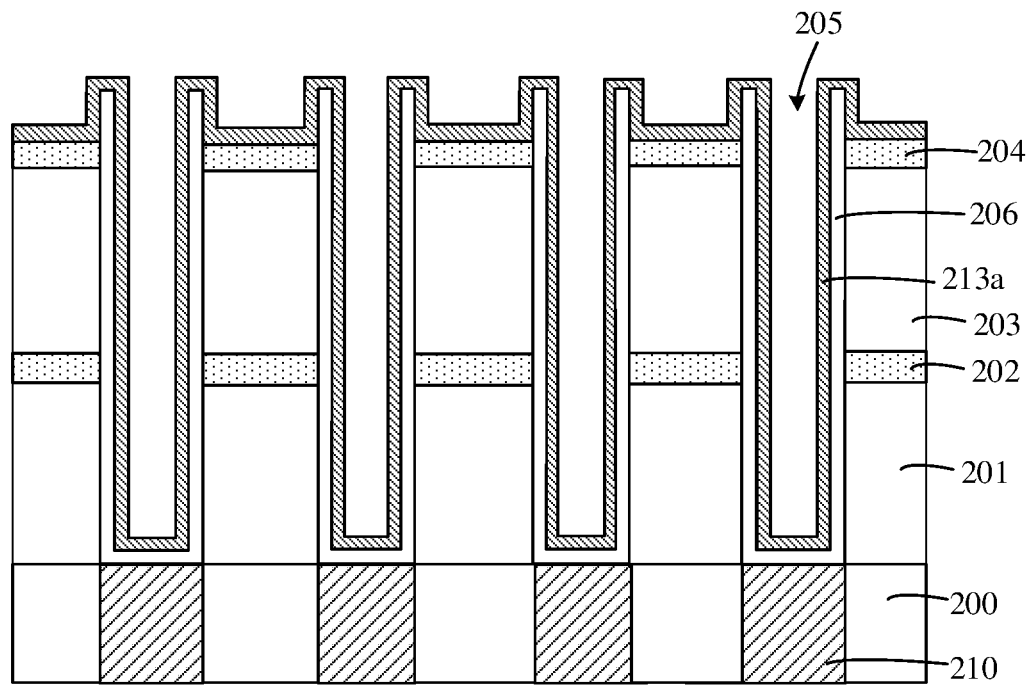
FIGS. 15-22 are schematic views of structures corresponding to various operations in a method for manufacturing a semiconductor structure according to an embodiment of the disclosure.

Referring to FIG. 15, a substrate 200 is provided, and a first isolating layer 201, a first stabilizing layer 202, a second isolating layer 203 and a second stabilizing layer 204, which are sequentially stacked onto one another, are formed on the substrate 200. A through hole 205 penetrating through the first isolating layer 201, the first stabilizing layer 202, the second isolating layer 203 and the second stabilizing layer 204 is formed. A lower electrode 206 is formed on a side wall and a bottom portion of the through hole 205. A portion of a thickness of the second stabilizing layer 204 is removed, so as to expose a portion of the lower electrode 206. The same or similar parts will be described with reference to the above embodiments, and will not be described in detail herein.

Referring to FIG. 15 to FIG. 18, a filling layer 218 for filling the through hole 205 is formed. A mask layer 217 is formed on the side wall of the exposed lower electrode 206. The mask layers 217 on the side walls of two adjacent lower electrodes 206 are in contact with each other.

In an embodiment of the disclosure, the filling layer 218 is in the form of a double-layer structure, and includes a first dielectric layer 213 and a first upper electrode 207. The first dielectric layer 213 covers an inner wall and a bottom portion of the lower electrode 206, and the first upper electrode 207 covers a surface of the first dielectric layer 213. That is, the capacitor in an embodiment of the disclosure is a cup-shaped capacitor, which can make full use of the inner wall and the side wall of the lower electrode 206, thereby increasing the amount of charges that can be stored.

The material of the first dielectric layer 213 is a high dielectric constant material, such as alumina or zirconia.

The material of the first upper electrode 207 is a conductive material, such as titanium nitride, titanium, or polycrystalline silicon. The filling layer 218 and the mask layer 217 are formed in a same process operation, so that the production process can be simplified, and the production cost can be reduced.

The operations of forming the filling layer 218 and the mask layer 217 will be described below.

Referring to FIG. 15, an initial first dielectric layer 213a is formed on the side wall, the inner wall and the bottom portion of the lower electrode 206, and on the surface of the second stabilizing layer 204. In an embodiment of the disclosure, the initial first dielectric layer 213a also covers the top surface of the lower electrode 206.

In an embodiment of the disclosure, the initial first dielectric layer 213a is formed through the atomic layer deposition process.

Figure 16:
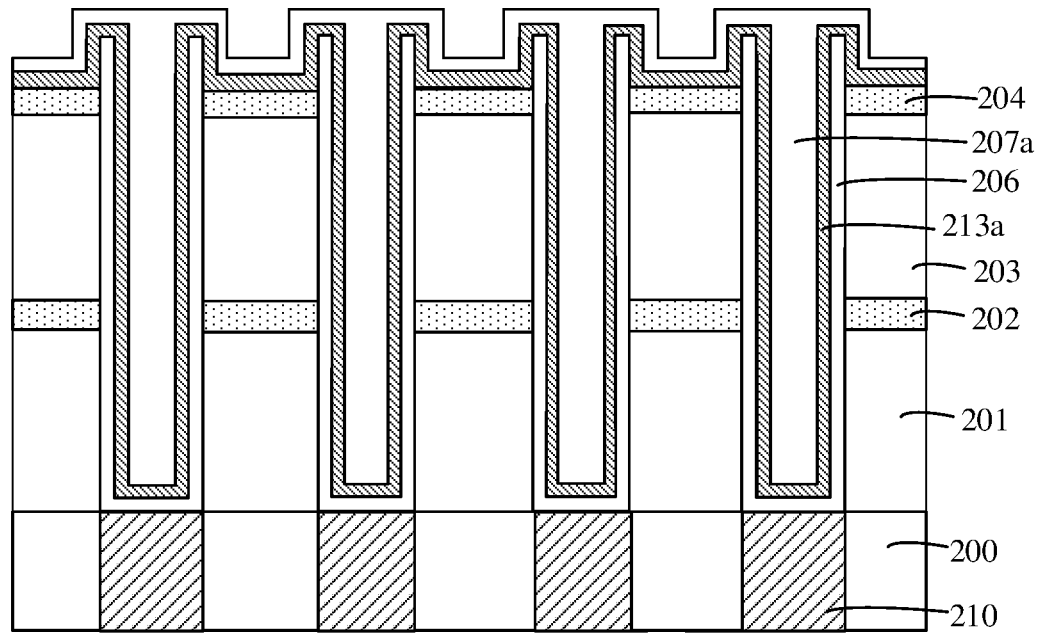

Referring to FIG. 16, an initial first upper electrode 207a is formed on the surface of the initial first dielectric layer 213a. In an embodiment of the disclosure, a portion of the initial first upper electrode 207a also fills the through hole 205 (referring to FIG. 15). A portion of the initial first upper electrode 207a is also arranged on the second stabilizing layer 204. A portion of the initial first upper electrode 207a is also arranged on the side wall of the lower electrode 206. A portion of the initial first upper electrode 207a also covers the top surface of the initial first dielectric layer 213a.

In an embodiment of the disclosure, the initial first upper electrode 207a is formed through the chemical vapor deposition process. The rate in the chemical vapor deposition process is relatively high, so that the production efficiency can be improved. The atomic layer deposition process or the physical vapor deposition technology may also be adopted in some embodiments of the disclosure.

Figure 17:
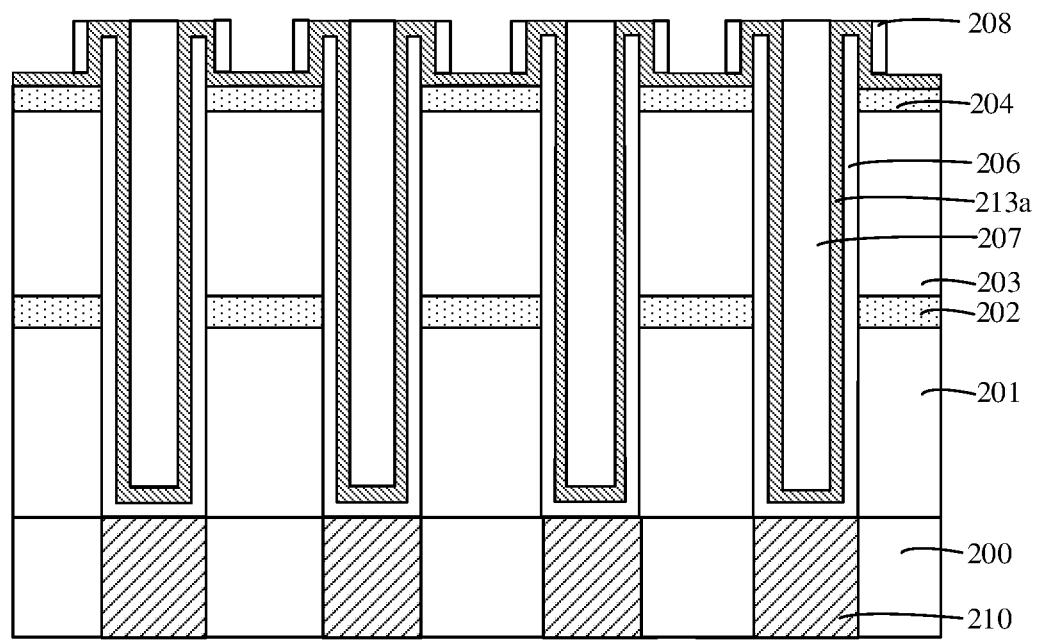

Referring to FIG. 17, a portion of the initial first upper electrode 207a (referring to FIG. 16) is removed, so as to form a first upper electrode 207 in the through hole 205 (referring to FIG. 15) and a first mask layer 208 on the side wall of the lower electrode 206.

That is, the first mask layer 208 and the first upper electrode 207 are formed in a same process operation.

In an embodiment of the disclosure, a portion of the initial first upper electrode 207a (referring to FIG. 16) on the second stabilizing layer 204 is removed, and the initial first upper electrode 207a higher than the top surface of the initial first dielectric layer 213a is also removed.

A top surface of the first upper electrode 207 is flush with a top surface of the first mask layer 208 and the top surface of the initial first dielectric layer 213a.

In an embodiment of the disclosure, the first upper electrode 207 and the first mask layer 208 are formed through the dry etching process. In some embodiments of the disclosure, the wet etching process may also be adopted.

Figure 18:
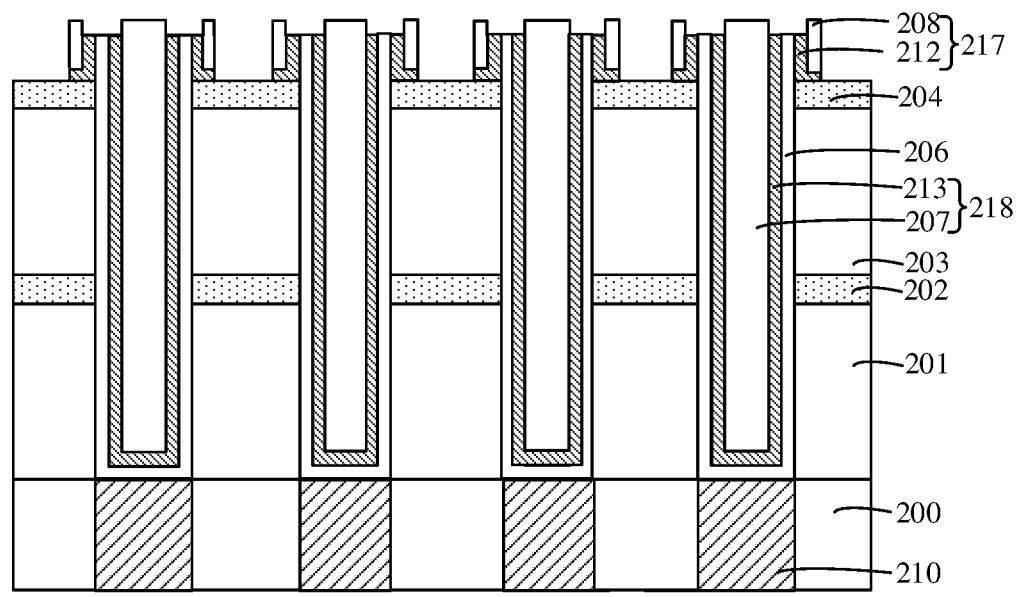

Referring to FIG. 18, a portion of the initial first dielectric layer 213a (referring to FIG. 17) is removed, so as to form a first dielectric layer 213 between the first upper electrode 207 and the lower electrode 206, and a second mask layer 212 in contact with the side wall of the lower electrode 206.

That is, the first upper electrode 207 and the second mask layer 212 are formed in a same process operation.

In an embodiment of the disclosure, the initial first dielectric layer 213a (referring to FIG. 17) higher than the top surface of the lower electrode 206, and a portion of the initial first dielectric layer 213a on the second stabilizing layer 204 are removed.

The top surface of the first dielectric layer 213 is flush with the top surface of the second mask layer 212 and the top surface of the lower electrode 206, and is lower than the top surface of the first mask layer 208 and the top surface of the first upper electrode 207. The main reasons why the top surface of the first upper electrode 207 is relatively high are described as follows. A second dielectric layer covering the side wall of the lower electrode 206 and a second upper electrode covering the second dielectric layer are sequentially formed. The first upper electrode 207 is higher than the top surface of the lower electrode 206 and the top surface of the first dielectric layer 213. An electrical connection between the second upper electrode and the first upper electrode 207 may be formed more easily in the subsequent process operations.

In an embodiment of the disclosure, a portion of the second mask layer 212 is also arranged between the first mask layer 208 and the lower electrode 206, and a portion of the second mask layer 212 also covers the bottom portion of the first mask layer 208.

The first mask layer 208 and the second mask layer 212 form a mask layer 217, and the first upper electrode 207 and the first dielectric layer 213 form a filling layer 218.

In an embodiment of the disclosure, the first dielectric layer 213 and the second mask layer 212 are formed through the dry etching process. In some embodiments of the disclosure, the wet etching process may also be adopted.

Figure 19:
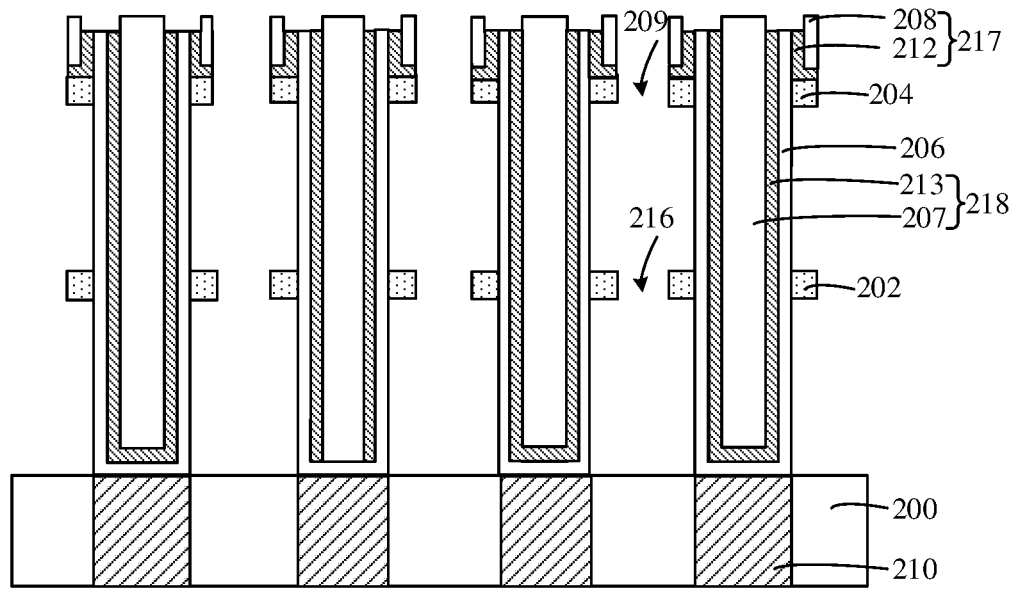

Referring to FIG. 19, the second stabilizing layer 204 is etched by using the mask layer 217 as a mask, that is, by using the first mask layer 208 and the second mask layer 212 as masks, so as to form a first opening 209. After forming the first opening 209, the second isolating layer 203 (referring to FIG. 18) is removed. After removing the second isolating layer 203, the first stabilizing layer 202 is etched by using the mask layer 217 as a mask, so as to form a second opening 216. After forming the second opening 216, the first isolating layer 201 (referring to FIG. 18) is removed.

In an embodiment of the disclosure, the second stabilizing layer 204 and the first stabilizing layer 202 are etched through the dry etching process, and the second isolating layer 203 and the first isolating layer 201 are removed through the wet etching process.

Figure 20:
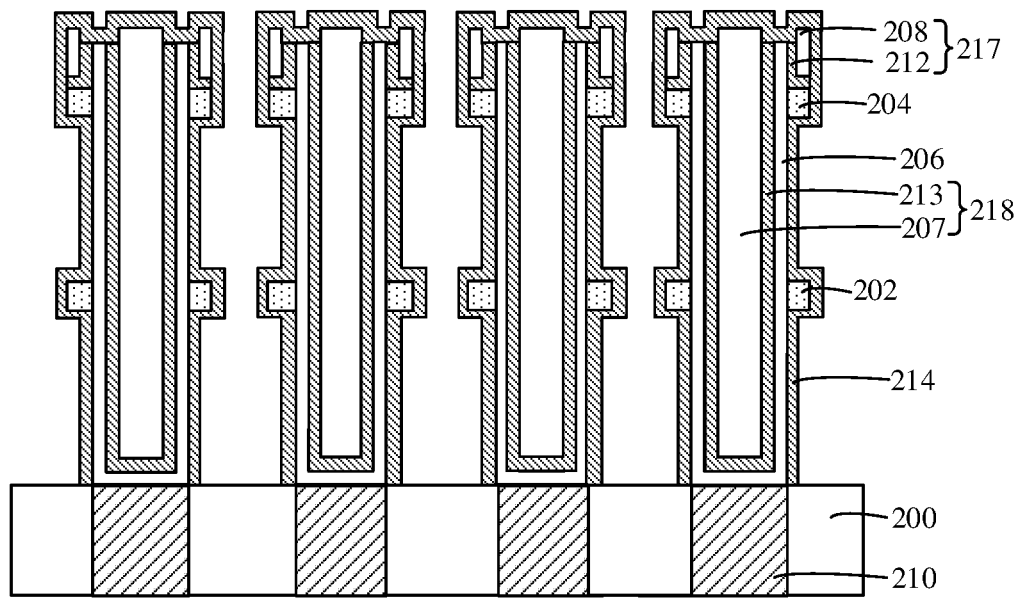

Referring to FIG. 20, a second dielectric layer 214 is formed on the side wall of the lower electrode 206 and the top surface of the filling layer 218. In an embodiment of the disclosure, the second dielectric layer 214 is also arranged on the surface of the first stabilizing layer 202 exposed by the first opening 209 (referring to FIG. 19), on the surface of the second stabilizing layer 204 exposed by the second opening 216 (referring to FIG. 19), and on the surface of the mask layer 217.

Since the second dielectric layer 214 is arranged on the top surface of the first dielectric layer 213, the second dielectric layer 214 is connected to the first dielectric layer 213, so as to jointly form a dielectric layer of the capacitor.

In an embodiment of the disclosure, the material of the second dielectric layer 214 is the same as the material of the first dielectric layer 213. In some embodiments of the disclosure, the material of the second dielectric layer may also be different from the material of the first dielectric layer.

Figure 21:
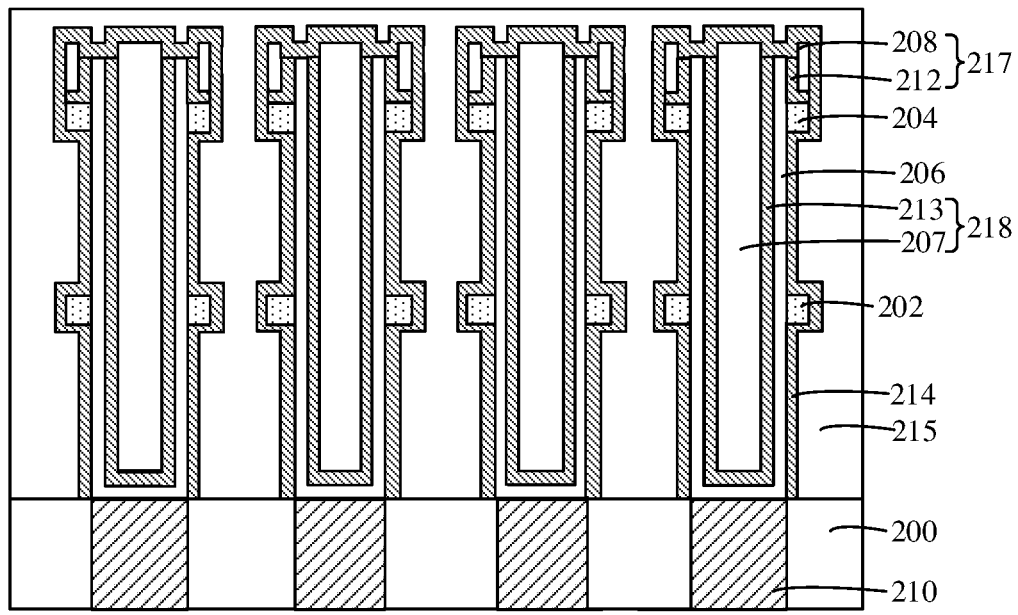

Referring to FIG. 21, a second upper electrode 215 is formed on the surface of the second dielectric layer 214, and the second upper electrode 215 also fills a region between two adjacent lower electrodes 206. In an embodiment of the disclosure, the second upper electrode 215 is formed through the chemical vapor deposition process. In some embodiments of the disclosure, the second upper electrode may also be formed through the atomic layer deposition process, and the second upper electrode is a thin film in contact with the second dielectric layer.

It should be noted that, in this case, the second upper electrode 215 and the first upper electrode 207 are still isolated from each other, but do not form an integrated upper electrode. Thus, the second upper electrode 215 needs to be electrically connected to the first upper electrode 207 sequentially.

Figure 22:
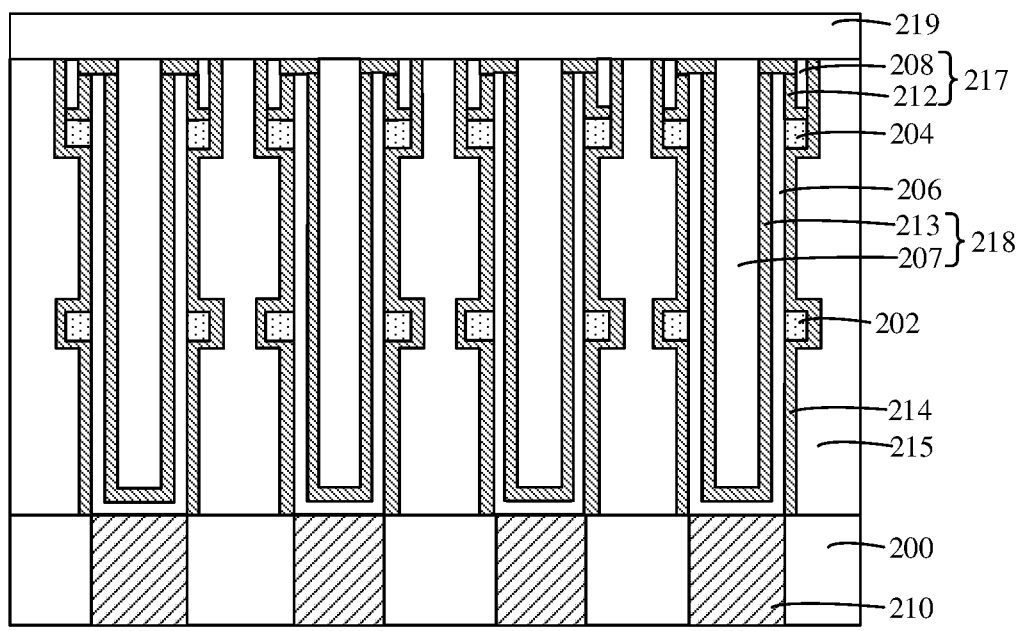

Referring to FIG. 22, the second dielectric layer 214 higher than the top surface of the first upper electrode 207 is removed, so as to expose the first upper electrode 207. In an embodiment of the disclosure, since a portion of the second upper electrode 215 is still higher than the top surface of the second dielectric layer 214, it is necessary to remove the second upper electrode 215 higher than the top surface of the second dielectric layer 214, so as to expose the first upper electrode 207.

A third upper electrode 219 is formed on the first upper electrode 207 and the second upper electrode 215. The third upper electrode 219 electrically connects the first upper electrode 207 to the second upper electrode 215. The first upper electrode 207, the second upper electrode 215 and the third upper electrode 219 jointly form an electrode of the capacitor.

In an embodiment of the disclosure, the third upper electrode 219 is also arranged on the mask layer 217.

In an embodiment of the disclosure, the material of the third upper electrode 219 is the same as the material of each of the first upper electrode 207 and the second upper electrode 215. In some embodiments of the disclosure, the material of the third upper electrode may also be different from the material of each of the first upper electrode and the second upper electrode.

In an embodiment of the disclosure, the second dielectric layer 214 and the second upper electrode 215, which are higher than the top surface of the first upper electrode 207, are removed through a chemical mechanical polishing process. The third upper electrode 219 is formed through the chemical vapor deposition process.

In an embodiment of the disclosure, the lower electrode 206, the first dielectric layer 213, the second dielectric layer 214, the first upper electrode 207, the second upper electrode 215 and the third upper electrode 219 form a cup-shaped capacitor.

Overall, in an embodiment of the disclosure, the filling layer 218 is in the form of a double-layer structure. That is, the capacitor is a cup-shaped capacitor, so that the inner wall and the side wall of the lower electrode 206 can be utilized, thereby increasing the amount of charges that can be stored in the capacitor. In addition, the mask layer 217 is formed on the side wall of the lower electrode 206, and the second stabilizing layer 204 is etched by using the mask layer 217 as a mask to form the first opening 209, so that the process difficulty can be reduced, and the quality of the capacitor can be improved. In addition, the first mask layer 208 and the first dielectric layer 213 are formed in a same process operation, and the second mask layer 212 and the first upper electrode 207 are formed in a same process operation, so that the production process can be simplified, and the production cost can be reduced.

An embodiment of the disclosure also provides a semiconductor structure. The semiconductor structure includes: a substrate; a first stabilizing layer and a second stabilizing layer separately arranged on the substrate, the first stabilizing layer being arranged close to the substrate, and the second stabilizing layer being arranged away from the substrate; a lower electrode penetrating through the first stabilizing layer and the second stabilizing layer, a bottom surface of the lower electrode being in contact with the substrate; and a mask layer arranged on a side wall of the lower electrode, the mask layer being further arranged on the second stabilizing layer, and the mask layers on the side walls of two adjacent lower electrodes being in contact with each other. The second stabilizing layer is provided with a first opening exposed by the mask layer. The semiconductor structure in the embodiment of the disclosure may be manufactured by the method for manufacturing the semiconductor structure provided by the above embodiments. FIG. 14 and FIG. 22 are schematic views of a semiconductor structure according to an embodiment of the disclosure.

Reference will now be made to the accompanying drawings.

In an embodiment of the disclosure, the semiconductor structure includes a capacitor.

Referring to FIG. 14, in an embodiment of the disclosure, a capacitive contact layer 110 is provided in a substrate 100. A lower electrode 106 is electrically connected to the capacitive contact layer 110.

A mask layer 108 is provided on a side wall of the lower electrode 106. That is, the lower electrode 106 is not etched and is not provided with an opening. Therefore, the lower electrode 106 is firmer and has better quality.

The semiconductor structure further includes a filling layer 107 arranged in the lower electrode 106. That is, the filling layer 107 covers an inner wall and a bottom portion of the lower electrode 106. The filling layer 107 is in the form of a single-layer structure. That is, the capacitor is a columnar capacitor. The columnar capacitor has higher strength, so that the columnar capacitor is not easy to collapse or tilt, and has better quality.

The material of the filling layer 107 is the same as the material of the mask layer 108, and contains polycrystalline silicon or germanium-silicon. The strength of polycrystalline silicon and germanium-silicon is relatively high, so that the firmness and stability of the capacitor can be improved.

In some embodiments of the disclosure, referring to FIG. 22, the semiconductor structure further includes a filling layer 218 arranged in the lower electrode 206. That is, the filling layer 218 covers the inner wall and the bottom portion of the lower electrode 206. The filling layer 218 is in the form of a double-layer structure and includes a first dielectric layer 213 and a first upper electrode 207. The first dielectric layer 213 covers the inner wall and the bottom portion of the lower electrode 206, and the first upper electrode 207 covers the surface of the first dielectric layer 213. That is, the capacitor is a cup-shaped capacitor, which can utilize the side wall and the inner wall of the lower electrode 206, thereby increasing the amount of charges that can be stored.

The semiconductor structure further includes a second dielectric layer 214 and a second upper electrode 215. The second dielectric layer 214 is arranged on the side wall of the lower electrode 206. The second upper electrode 215 covers the surface of the second dielectric layer 214.

The semiconductor structure further includes a third upper electrode 219. The third upper electrode 219 is arranged on the first upper electrode 207 and the second upper electrode 215. The third upper electrode 219 electrically connects the second upper electrode 215 to the first upper electrode 207. The first upper electrode 207, the second upper electrode 215 and the third upper electrode 219 jointly form an upper electrode.

A mask layer 217 is provided on the side wall of the lower electrode 206. That is, the lower electrode 206 is not etched and is not provided with an opening. Therefore, the lower electrode 206 is firmer and has better quality.

Overall, in an embodiment of the disclosure, the columnar capacitor has larger strength, while the cup-shaped capacitor can accommodate more charges. In addition, the lower electrode of each of the columnar capacitor and the cup-shaped capacitor is not provided with an opening formed by etching, so that the stability of the lower electrode is better.

Those of ordinary skill in the art may understand that the above embodiments are specific embodiments to implement the disclosure. In practical applications, various changes may be made in forms and details without departing from the spirit and scope of the disclosure. Any person skilled in the art may make changes and modifications without departing from the spirit and scope of the disclosure. Therefore, the protection scope of the disclosure should be subject to the scope defined by the appended claims.

The invention claimed is:

1. A method for manufacturing a semiconductor structure, comprising:
    providing a substrate, and forming a first isolating layer, a first stabilizing layer, a second isolating layer and a second stabilizing layer, which are sequentially stacked onto one another, on the substrate;
    forming a through hole penetrating through the first isolating layer, the first stabilizing layer, the second isolating layer and the second stabilizing layer, and forming a lower electrode on a side wall and a bottom portion of the through hole;
    removing a portion of a thickness of the second stabilizing layer to expose a portion of the lower electrode;
    forming a mask layer on a side wall of the exposed lower electrode, wherein the mask layers on the side walls of two adjacent lower electrodes are in contact with each other; and
    etching the second stabilizing layer by using the mask layer as a mask to form a first opening.

2. The method for manufacturing the semiconductor structure of claim 1, wherein after removing the portion of the thickness of the second stabilizing layer, the method further comprises: forming a filling layer for filling the through hole, wherein the filling layer is in the form of a single-layer structure, and the filling layer and the mask layer are formed in a same process operation.

3. The method for manufacturing the semiconductor structure of claim 2, wherein forming the filling layer and the mask layer comprises: forming an initial filling layer in the through hole, on the side wall of the exposed lower electrode, and on a surface of the second stabilizing layer; and removing a portion of the initial filling layer on the surface of the second stabilizing layer to form the filling layer in the through hole and the mask layer on the side wall of the lower electrode.

4. The method for manufacturing the semiconductor structure of claim 1, wherein after removing the portion of the thickness of the second stabilizing layer, the method further comprises: forming a filling layer for filling the through hole, wherein the filling layer is in the form of a double-layer structure and comprises a first dielectric layer and a first upper electrode, the first dielectric layer covers an inner wall and a bottom portion of the lower electrode, the first upper electrode covers a surface of the first dielectric layer, and the filling layer and the mask layer are formed in a same process operation.

5. The method for manufacturing the semiconductor structure of claim 4, wherein forming the filling layer and the mask layer further comprises:
    forming an initial first dielectric layer on the side wall, the inner wall and the bottom portion of the lower electrode and on a surface of the second stabilizing layer;
    forming an initial first upper electrode on a surface of the initial first dielectric layer;
    removing a portion of the initial first upper electrode to form the first upper electrode in the through hole and a first mask layer on the side wall of the lower electrode, wherein a top surface of the first upper electrode is flush with a top surface of the first mask layer and a top surface of the initial first dielectric layer; and
    removing a portion of the initial first dielectric layer to form the first dielectric layer between the first upper electrode and the lower electrode, and a second mask layer in contact with the side wall of the lower electrode, wherein a top surface of the first dielectric layer is flush with a top surface of the second mask layer and a top surface of the lower electrode, and is lower than the top surface of the first mask layer and the top surface of the first upper electrode, the first mask layer and the second mask layer form the mask layer, and the first upper electrode and the first dielectric layer form the filling layer.

6. The method for manufacturing the semiconductor structure of claim 4, wherein after forming the first opening, the method further comprises: removing the second isolating layer; after removing the second isolating layer, etching the first stabilizing layer by using the mask layer as a mask to form a second opening; and after forming the second opening, removing the first isolating layer.

7. The method for manufacturing the semiconductor structure of claim 6, wherein after removing the first isolating layer, the method further comprises: forming a second dielectric layer on the side wall of the lower electrode and a top surface of the filling layer; and after forming the second dielectric layer, forming a second upper electrode on a surface of the second dielectric layer.

8. The method for manufacturing the semiconductor structure of claim 7, wherein after forming the second upper electrode, the method further comprises: removing the second dielectric layer higher than a top surface of the first upper electrode to expose the first upper electrode; and forming a third upper electrode on the first upper electrode and the second upper electrode, wherein the first upper electrode is electrically connected to the second upper electrode through the third upper electrode.

\* \* \* \* \*